US011226356B2

(12) United States Patent
Endo

(10) Patent No.: US 11,226,356 B2
(45) Date of Patent: Jan. 18, 2022

(54) SHUNT RESISTOR AND SHUNT RESISTOR MOUNT STRUCTURE

(71) Applicant: KOA CORPORATION, Ina (JP)

(72) Inventor: Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 17/053,228

(22) PCT Filed: May 8, 2019

(86) PCT No.: PCT/JP2019/018362
§ 371 (c)(1),
(2) Date: Nov. 5, 2020

(87) PCT Pub. No.: WO2019/220965
PCT Pub. Date: Nov. 21, 2019

(65) Prior Publication Data
US 2021/0311096 A1 Oct. 7, 2021

(30) Foreign Application Priority Data

May 18, 2018 (JP) .............................. JP2018-096178

(51) Int. Cl.
*G01R 1/20* (2006.01)
*H01C 1/01* (2006.01)
(Continued)

(52) U.S. Cl.
CPC .............. *G01R 1/203* (2013.01); *H01C 1/01* (2013.01); *H01C 1/148* (2013.01); *H01C 13/00* (2013.01)

(58) Field of Classification Search
CPC .......... H01C 1/10; H01C 1/148; H01C 13/00; G01R 1/203
See application file for complete search history.

(56) References Cited

U.S. PATENT DOCUMENTS 2,708,701 A * 5/1955 Viola .................... G01R 1/203
338/49
8,730,003 B2 * 5/2014 Smith .................... H01C 1/144
338/332

(Continued)

FOREIGN PATENT DOCUMENTS

JP    2017-212297 A   11/2017
WO   WO 2013-005824 A1   1/2013

OTHER PUBLICATIONS

PL157615, Buyno, machine translation. (Year: 1992).*

(Continued)

*Primary Examiner* — Kyung S Lee
(74) *Attorney, Agent, or Firm* — Crowell & Moring LLP

(57) ABSTRACT

Provided is a shunt resistor including: a first terminal and a second terminal each made of an electrically conductive metal material and having a first plane, a second plane, and an outer peripheral surface around the planes; and a resistive body connected to the respective first planes and connecting the first terminal and the second terminal, the first planes of the first terminal and the second terminal opposing each other. A bonding area between the resistive body and the first planes is smaller than an area of the first planes. The first terminal and the second terminal each have a hole penetrating through from the first plane to the second plane. A voltage detection terminal is connected to opposing surface sides of the first terminal and the second terminal.

4 Claims, 6 Drawing Sheets

(51) Int. Cl.
    *H01C 1/148*          (2006.01)
    *H01C 13/00*         (2006.01)

(56) References Cited

U.S. PATENT DOCUMENTS

| | | | |
|---|---|---|---|
| 9,378,873 B2* | 6/2016 | Yoshioka | H01C 17/281 |
| 9,625,494 B2* | 4/2017 | Nakamura | H01C 3/02 |
| 10,614,933 B2* | 4/2020 | Endo | H01C 13/00 |
| 2012/0229247 A1* | 9/2012 | Yoshioka | G01R 1/203 |
| | | | 338/49 |
| 2014/0097933 A1 | 4/2014 | Yoshioka et al. | |
| 2019/0295749 A1 | 9/2019 | Endo | |

OTHER PUBLICATIONS

JP2008-047571, Nishio et al., machine translation. (Year: 2008).*
English translation of International Search Report, and Written Opinion, from Application No. PCT/JP2019/018362, dated Jul. 16, 2019, 4 pages.

* cited by examiner

SHUNT RESISTOR AND SHUNT RESISTOR MOUNT STRUCTURE

This application is a 371 application of PCT/JP2019/018362 having an international filing date of May 8, 2019, which claims priority to JP2018-096178 filed May 18, 2018, the entire content of each of which is incorporated herein by reference.

TECHNICAL FIELD

The present invention relates to a shunt resistor and a shunt resistor mount structure.

BACKGROUND ART

For example, a shunt resistor is used to detect an electric current in a semiconductor power module or the like mounted in an electric vehicle.

Patent Literature 1 describes a shunt resistor which is easy to attach, does not require an excessively large attachment space, and is capable of performing highly accurate current detection.

The shunt resistor described in Patent Literature 1 includes: a first terminal and a second terminal each made of an electrically conductive metal material and having a first plane, a second plane, and an outer peripheral surface around the planes; and resistive bodies connected to the respective first planes and connecting the first terminal and the second terminal together, with the first plane of the first terminal and the first plane of the second terminal opposing each other. The bonding area between the resistive bodies and the first planes is smaller than the area of the first planes. The first terminal and the second terminal each have a hole formed penetrating through from the first plane to the second plane.

In the following, such a shunt resistor may be referred to as a "bushing shunt (resistor)".

CITATION LIST

Patent Literature

Patent Literature 1: JP 2017-212297A

SUMMARY OF INVENTION

Technical Problem

In the bushing shunt described in Patent Literature 1, a structure is adopted in which output signal voltage lead-out terminals are led out from the respective side surfaces of the first terminal and the second terminal.

In a bushing shunt, it is desirable to suppress electromotive force noise due to a magnetic flux.

An aim of the present invention is to provide a bushing shunt resistor having an output signal voltage lead-out terminal structure for suppressing electromotive force noise due to a magnetic flux.

Solution to Problem

According to an aspect of the present invention, there is provided a shunt resistor including: a first terminal and a second terminal each made of an electrically conductive metal material and having a first plane, a second plane, and an outer peripheral surface around the planes; and a resistive body connected to the respective first planes and connecting the first terminal and the second terminal, the respective first planes of the first terminal and the second terminal opposing each other. A bonding area between the resistive body and the respective first planes is smaller than an area of the first planes. The first terminal and the second terminal each have a hole penetrating through from the first plane to the second plane. A voltage detection terminal is connected to opposing surface sides of the first terminal and the second terminal.

The present invention also provides an mount structure of the shunt resistor. A slit portion is formed in the opposing surface sides of the first terminal and the second terminal, and a substrate formed with the voltage detection terminal is inserted into the slit portion.

The slit portion may extend from lateral end portions of the first terminal and the second terminal in a direction toward the respective holes.

The voltage detection terminal may be connected to the first terminal or the second terminal in the slit portion.

Preferably, the voltage detection terminal may be formed on a front and back of the substrate.

The description includes the contents disclosed in JP Patent Application No. 2018-096178 based on which the present application claims priority.

Advantageous Effects of Invention

According to the present invention, it is possible to suppress electromotive force noise due to a magnetic flux in a bushing shunt resistor.

DESCRIPTION OF EMBODIMENTS

In the following, shunt resistors and mount structures thereof according to embodiments of the present invention will be described with reference to the drawings.

First Embodiment

First, a first embodiment of the present invention will be described.

Figure 1:
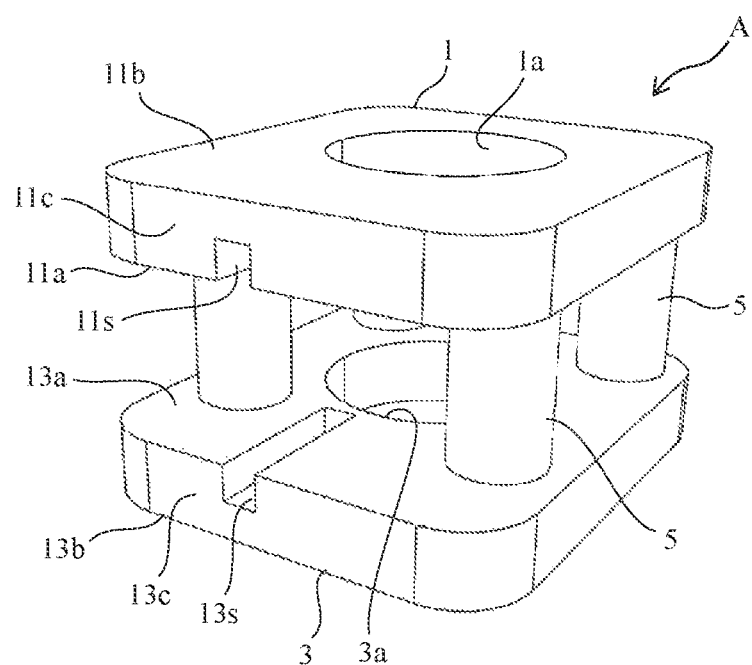
FIG. 1 is a perspective view illustrating a configuration example of a shunt resistor according to a first embodiment of the present invention.

FIG. 1 is a perspective view illustrating a configuration example of a shunt resistor according to the present embodiment.

A shunt resistor A according to the present embodiment includes: a first terminal (electrode) 1 made of an electrically conductive metal material, such as Cu, and having a first plane 11a, a second plane 11b on the back surface side thereof, and an outer peripheral surface (side surface) 11c around the planes; and a second terminal (electrode) 3 made of an electrically conductive metal material, such as Cu, and having a first plane 13a, a second plane 13b, and an outer peripheral surface (side surface) 13c around the planes.

Further, the first terminal 1 and the second terminal 3 respectively have holes 1a, 3a formed penetrating through from the first planes 11a, 13a to the second planes 11b, 13b.

The respective first planes 11a, 13a of the first terminal 1 and the second terminal 3 oppose each other. A plurality of resistive bodies 5 connecting the first terminal 1 and the second terminal 3 in parallel are provided on the respective first planes 11a, 13a. Examples of the material of the resistive bodies 5 include Cu—Ni based, Cu—Mn based, and Ni—Cr based metal materials.

The bonding area between the upper surfaces and lower surfaces of the resistive bodies 5 and the respective first planes 11a, 13a is smaller than the area of the first planes 11a, 13a. In the present example, the plurality of resistive bodies 5 are arranged concentrically about the holes (center holes) 1a, 3a respectively formed in the first terminal 1 and the second terminal 3, at regular intervals along the circumferential direction, for example.

The first terminal 1 and the second terminal 3 may be polygonal, such as triangular, as well as rectangular, and may be circular. The holes 1a, 3a may be polygonal such as rectangular, as well as circular. The same applies to other examples.

In FIG. 1, the respective outer peripheral surfaces (side surfaces) 11c, 13c of the first terminal 1 and the second terminal 3 respectively have slit portions (groove portions) 11s, 13s provided in opposing positions on the opposing surface sides of the first terminal 1 and the second terminal 3. The slit portions extend from lateral end portions of the first terminal 1 and the second terminal 3 in a direction toward the holes 1a, 3a (central direction).

Figure 2A:
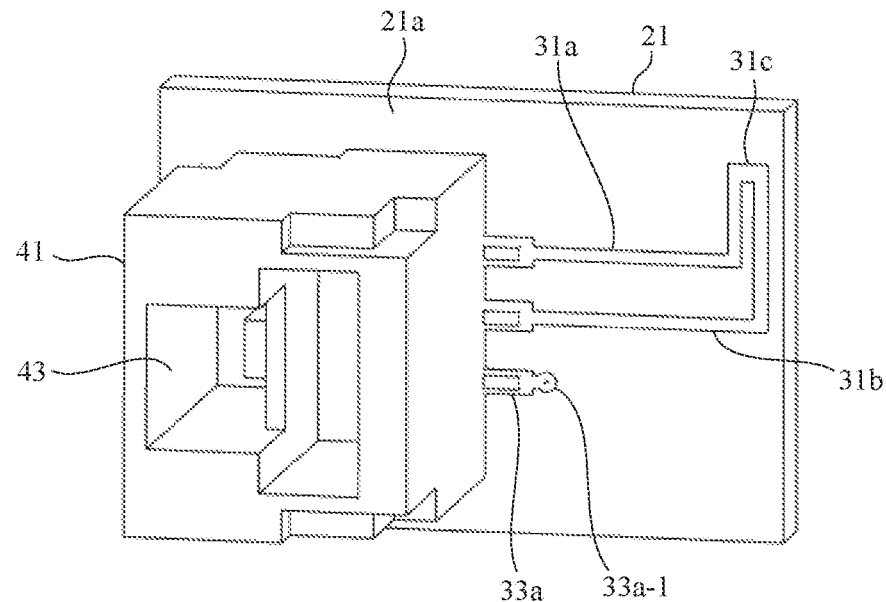
FIG. 2A illustrates an example of a substrate with voltage detection terminals and the like, which is attached to the shunt resistor illustrated in FIG. 1, as viewed from one surface side (front surface side) of the substrate.
Figure 2B:
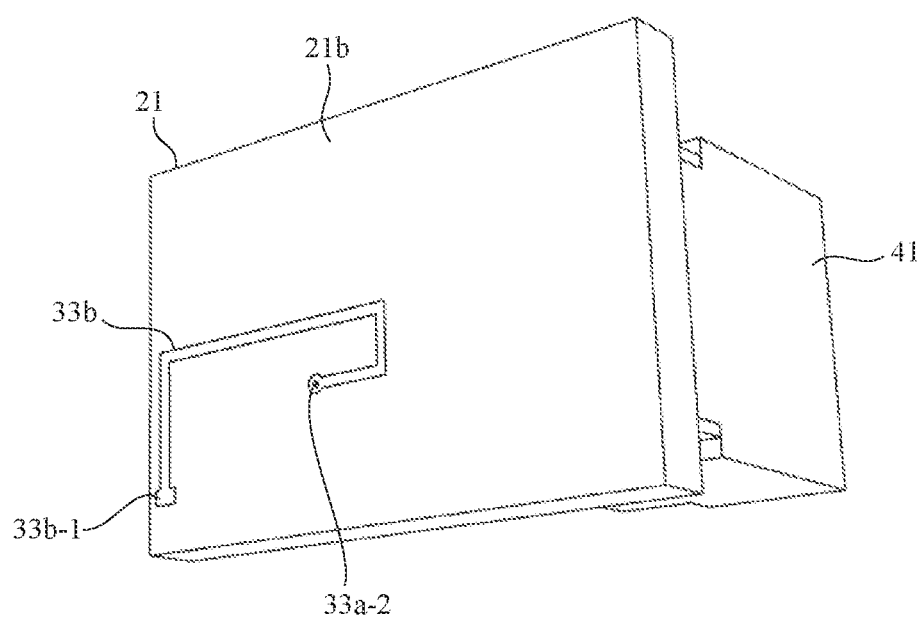
FIG. 2B illustrates the example of the substrate with voltage detection terminals and the like, which is attached to the shunt resistor illustrated in FIG. 1, as viewed from a back-surface side of the substrate.

FIG. 2A and FIG. 2B illustrate an example of a substrate having voltage detection terminals and the like, which is attached to the shunt resistor A illustrated in FIG. 1, as viewed from one surface side (front surface side) of the substrate and from the back-surface side thereof, respectively. The substrate may be a printed circuit board or the like.

As illustrated in FIG. 2A, when the substrate 21 is viewed from one surface 21a side thereof, a connector 41 is attached to the one surface 21a of the substrate 21. The connector 41 has a connection hole 43 for connecting a signal cable or the like, which is not illustrated. The connector 41 is formed with: first voltage detection terminals 31a, 31b (one of which, such as 31b, is a terminal for noise removal) meandering on the one surface 21a of the substrate 21; and a second voltage detection terminal 33a. The first voltage detection terminals 31a, 31b are electrically connected in a corner of the substrate 21, for example, where a first pad 31c is formed.

As illustrated in FIG. 2B, when the substrate 21 is viewed from one surface 21b side on the back-surface side of the one surface 21a, a second voltage detection terminal 33b is provided on one surface 21b. The second voltage detection terminal 33b has a second pad 33b-1 formed in a corner of the substrate 21, for example.

The second voltage detection terminals 33a, 33b are connected from top to bottom through of the substrate 21 in the thickness direction thereof, by means of a via (for example, a metal material such as solder) disposed at a first position 33a-1 and a second position 33a-2 located at the same in-plane positions.

Thus, the substrate 21 is formed with the first voltage detection terminals 31a, 31b, the second voltage detection terminal 33b, and the connector 41.

Figure 3A:
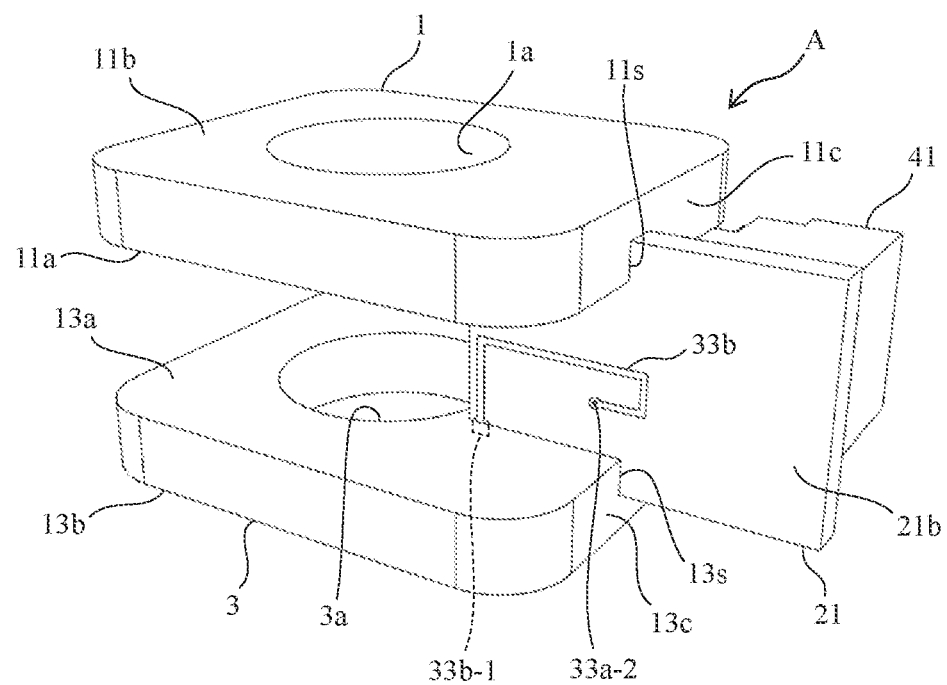
FIG. 3A is a perspective view illustrating a state in which opposing sides of the substrate are respectively inserted into slit portions of the shunt resistor.
Figure 3B:
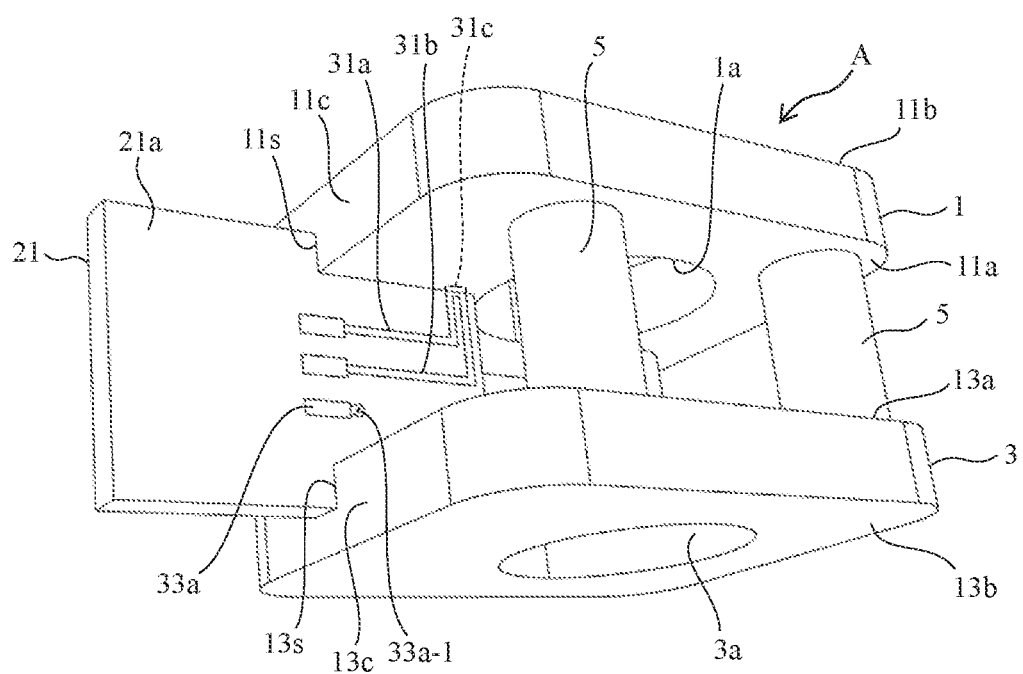
FIG. 3B is a perspective view illustrating the state in which the opposing sides of the substrate are respectively inserted into the slit portions of the shunt resistor, as viewed from a direction on the opposite side to FIG. 3A.

FIG. 3A is a perspective view illustrating a state in which opposing two sides of the substrate 21 are respectively inserted into the slit portion 11s, 13s of the shunt resistor A. In FIG. 3A, the second voltage detection terminal 33b is visible. FIG. 3B is a perspective view from a direction on the opposite side to FIG. 3A. In FIG. 3B, the first voltage detection terminals 31a, 31b are visible. The pair of output signal lines of the first voltage detection terminal 31a and the second voltage detection terminal 33b form a parallel pattern on the front and back of the substrate.

The first pad 31c and the second pad 33b-1 are respectively electrically connected to the first terminal 1 and the second terminal 3 in the slits 11s, 13s. Thus, the voltage detection terminals (electric current terminals) are configured to be connected at locations close to the holes (center holes) 1a, 3a of the bushing shunt where magnetic flux generation is smaller.

As described above, according to the shunt resistor and the shunt resistor mount structure of the present embodiment, in the bushing shunt resistor, the output signal voltage lead-out structure is configured such that the voltage detection terminals can be connected at locations close to the holes (center holes) 1a, 3a of the bushing shunt where magnetic flux generation is smaller. Accordingly, electromotive force noise due to a magnetic flux can be suppressed. The obtained signals are connected to the connector by means of the substrate wiring. Because the pair of output signal lines of the first voltage detection terminals 31a, 31b and the second voltage detection terminal 33b form a parallel pattern on the front and back of the substrate, the influence of magnetic flux noise can be suppressed.

Second Embodiment

Next, a second embodiment of the present invention will be described. In the first embodiment, slit portions are formed in the opposing surface sides of the first terminal and the second terminal to connect the voltage detection terminals to the shunt resistor.

In the present embodiment, a substrate formed with voltage detection terminals is fixed to the shunt resistor using L-shaped terminals, for example, which are fixed to the terminals by means of fixing members such as screws.

Figure 4:
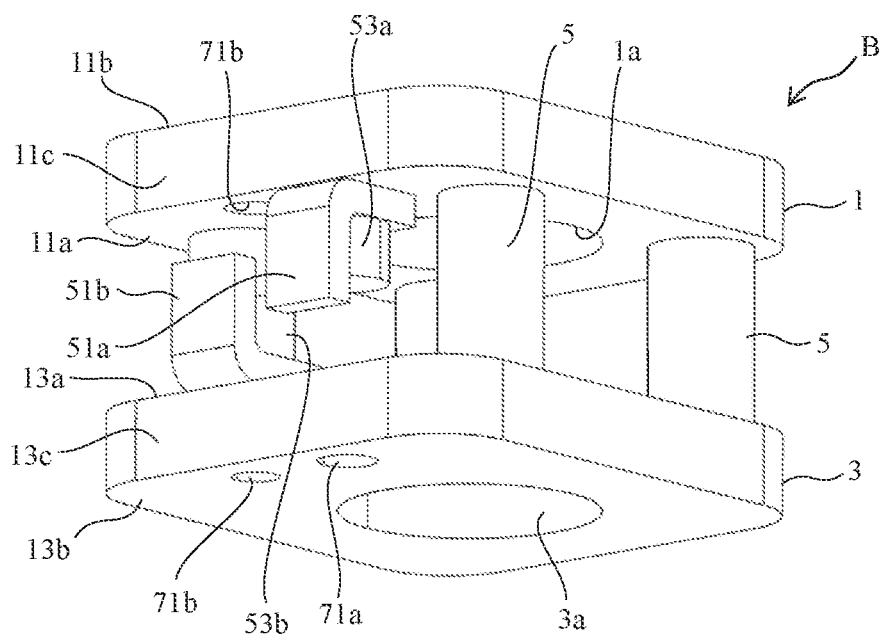
FIG. 4 is a perspective view illustrating a configuration example of a shunt resistor according to a second embodiment of the present invention.
Figure 5:
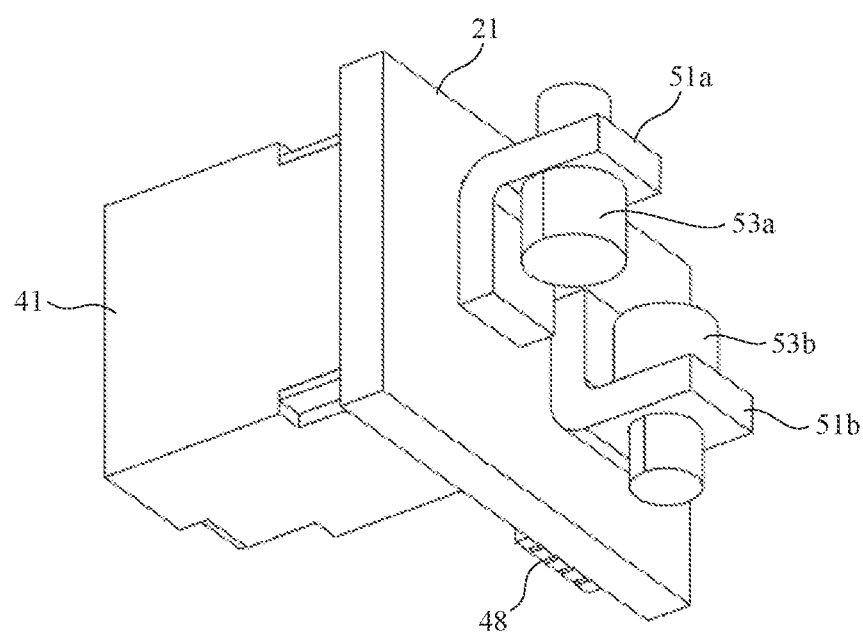
FIG. 5 is a perspective view illustrating a configuration example of the substrate equipped with a connector.

FIG. 4 is a perspective view illustrating a configuration example of a shunt resistor according to the present embodiment. FIG. 5 is a perspective view illustrating a configuration example of the substrate equipped with a connector.

With regard to the bushing shunt, one similar to that of the first embodiment may be used. As illustrated in FIG. 4, in a shunt resistor B of the present embodiment, L-shaped terminals 51a, 51b which are respectively bent toward the opposite surfaces are respectively provided on the opposing first planes 11a, 13a of the first terminal 1 and the second terminal 3 by means of fixing members 53a, 53b, such as screws. FIG. 5 illustrates a state excluding the shunt resistor B in which the L-shaped terminals 51a, 51 b are fixed to the substrate 21. The L-shaped terminals are disposed on one surface side of the substrate 21, and the connector 41 and an external terminal 48 are disposed on the other one surface side.

Figure 6A:
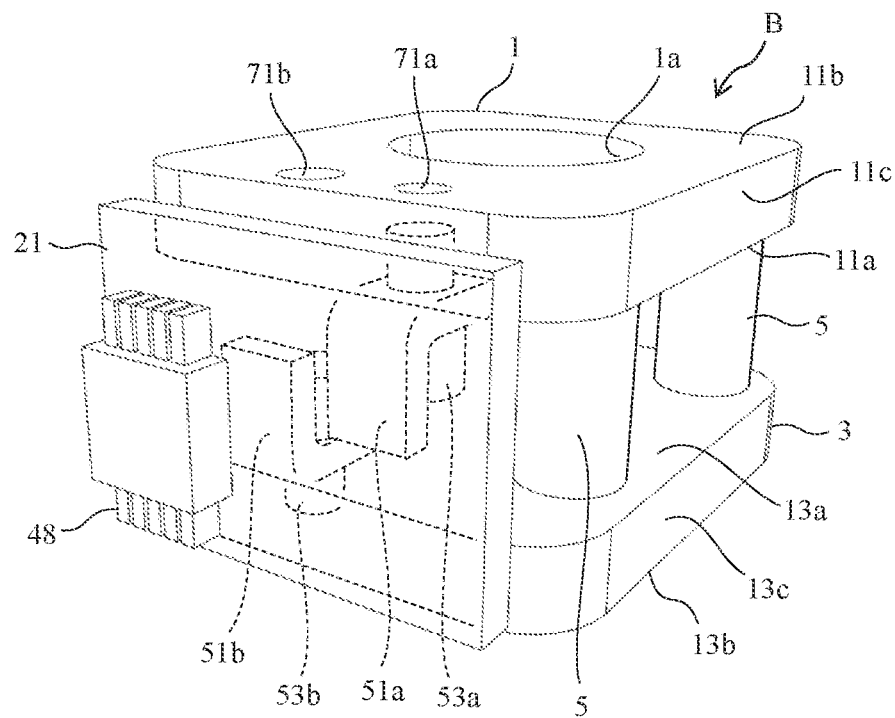
FIG. 6A is a perspective view associated with FIG. 4 and FIG. 5 and illustrating a state in which the substrate is fixed to the shunt resistor by means of L-shaped terminals and fixing screws.
Figure 6B:
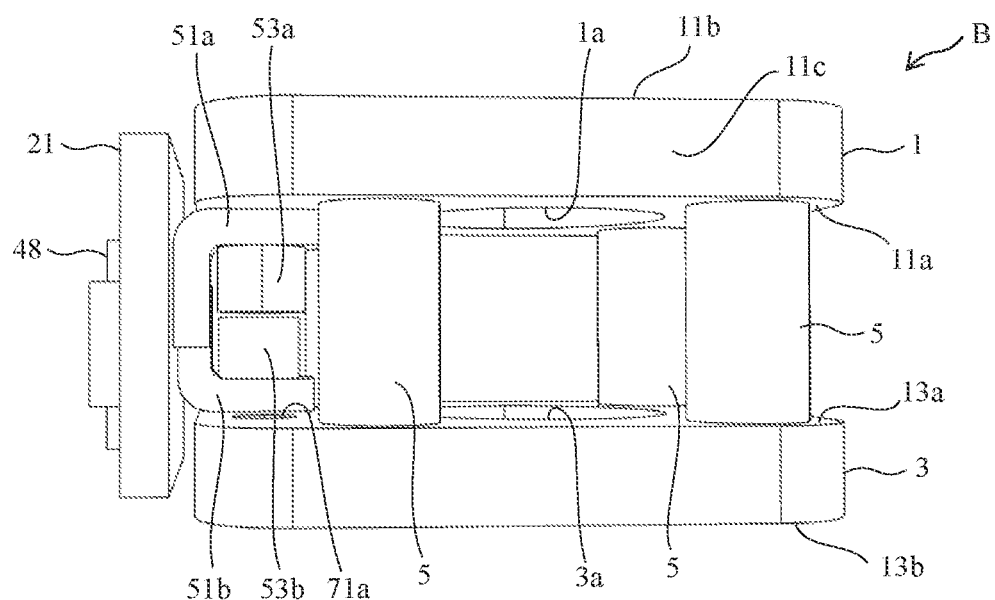
FIG. 6B is a side view associated with FIG. 4 and FIG. 5 and illustrating a state in which the substrate is fixed to the shunt resistor by means of the L-shaped terminals and the fixing screws.
Figure 7A:
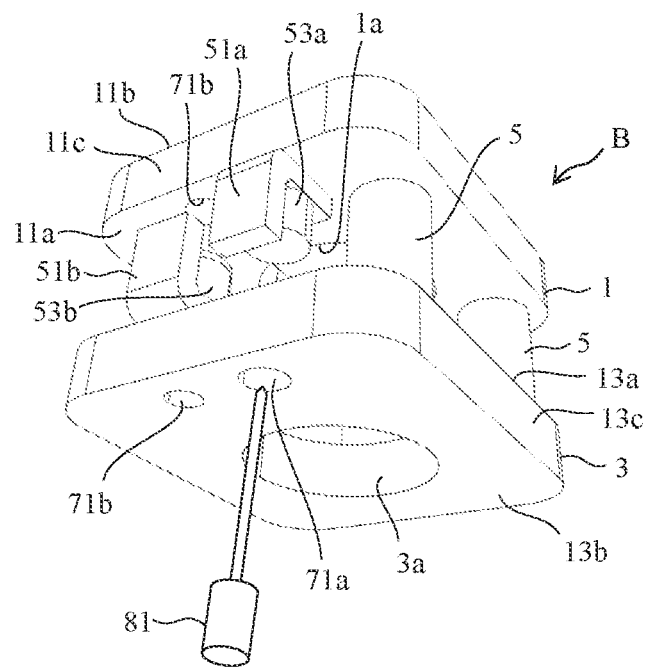
FIG. 7A illustrates an example of a fixing portion fixing method according to the present embodiment.
Figure 7B:
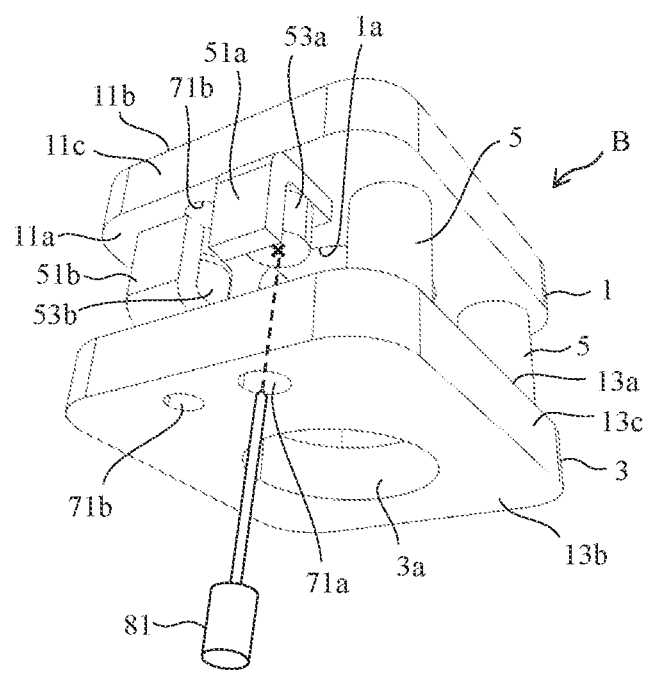
FIG. 7B illustrates the example of the fixing member fixing method according to the present embodiment, the view continuing from FIG. 7A.

FIG. 6A and FIG. 6B, which are associated with FIG. 4 and FIG. 5, are respectively a perspective view and a side view illustrating a state in which the substrate 21 is fixed to the shunt resistor B by means of the L-shaped terminals 51a, 51b and the fixing screws 53a, 53b. FIG. 7A and FIG. 7B illustrate an example of a method for fixing the fixing members 53a, 53b according to the present embodiment.

As illustrated in FIG. 6A and FIG. 6B, the L-shaped terminals 51a, 51b with the shunt resistor B fixed thereto by means of the fixing members 53a, 53b are respectively connected to the opposing first planes 11a, 13a of the first terminal 1 and the second terminal 3, and are connected to the wires (voltage detection terminals) 31a, 33a connected to the connector 41, in a manner similar to the first embodiment, as illustrated in FIG. 2A, for example.

Next, an operation step for fixing, to the shunt resistor B, the L-shaped terminals fixed to the terminals by means of fixing members, such as screws is described.

As illustrated in FIG. 7A and FIG. 7B, a fixing tool, such as a driver 81, for fixing the fixing members 53a, 53b, such as screws, is passed through the hole 71a, 71b formed in the second terminal 3, upon assembly, and the fixing members 53a, 53b are screwed by means of the driver 81, whereby the L-shaped terminals 51a, 51b can be fixed onto the first terminal 1.

Thus, according to the present embodiment, a configuration similar to that of the first embodiment can be obtained using a different means for fixing the voltage detection terminals, and also similar effects can be obtained.

In the foregoing embodiments, the configurations and the like illustrated in the attached drawings are not to be taken as limiting, but may be modified, as appropriate, as long as the effects of the present invention can be obtained. Other changes may be made, as appropriate, and mounted without departing from the scope of the purpose of the present invention.

The respective constituent elements of the present invention may be selectively adopted, and an invention provided with a selected configuration is also included in the present invention.

INDUSTRIAL APPLICABILITY

The present invention may be the utilized in a shunt resistor.

The invention claimed is:

1. A shunt resistor comprising:
    a first terminal and a second terminal each made of an electrically conductive metal material and having a first plane, a second plane, and an outer peripheral surface around the planes; and
    a resistive body connected to the respective first planes and connecting the first terminal and the second terminal, the respective first planes of the first terminal and the second terminal opposing each other,
    wherein a bonding area between the resistive body and the respective first planes is smaller than an area of the first planes, the first terminal and the second terminal each having a hole penetrating through from the first plane to the second plane,
    a voltage detection terminal is connected to opposing surface sides of the first terminal and the second terminal,
    a slit portion is formed in the opposing surface sides of the first terminal and the second terminal, and
    a substrate formed with the voltage detection terminal is inserted into the slit portion.

2. The shunt resistor mount structure according to claim 1, wherein the slit portion extends from lateral end portions of the first terminal and the second terminal in a direction toward the respective holes.

3. The shunt resistor mount structure according to claim 1, wherein the voltage detection terminal is connected to the first terminal or the second terminal in the slit portion.

4. The shunt resistor mount structure according to claim 1, wherein the voltage detection terminal is formed on a front and back of the substrate.

* * * * *